(12) United States Patent
Sholley et al.

(10) Patent No.: US 6,265,774 B1
(45) Date of Patent: Jul. 24, 2001

(54) MILLIMETER WAVE ADJUSTABLE CAVITY PACKAGE

(75) Inventors: Michael D. Sholley, Long Beach; Jeffrey B. Mitchell, Encino; Gregory K. Barber, Torrance; Charles E. Gage, Los Angeles; Bruce E. Osgood, Moreno Valley, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/195,930

(22) Filed: Nov. 19, 1998

(51) Int. Cl.[7] .................................................. H01L 23/34
(52) U.S. Cl. ........................................... 257/728; 257/708
(58) Field of Search .................................... 257/728, 730, 257/708; 330/66

(56) References Cited

U.S. PATENT DOCUMENTS 5,045,820 * 9/1991 Leitch et al. ............................. 333/26
6,040,739 * 3/2000 Wedeen et al. ......................... 330/66
6,121,833 * 9/2000 Rattay et al. ............................ 330/53

* cited by examiner

*Primary Examiner*—Roy Potter
(74) *Attorney, Agent, or Firm*—Michael S. Yatsko; Ronald M. Goldman

(57) ABSTRACT

Development of Millimeter Wave Devices containing MMIC's is expedited by use of a new package for the MMIC's and associated electrical components that define the functional circuit. The package includes a base plate and a plurality of metal inserts removeably fastened to the base plate. The inserts are spaced apart and contain a profiled edge with the profiled edge in one in confronting spaced relationship with that of another of the inserts. Together with the backplate, the profiled edges define elongated cavities, serving as two of the cavities side walls. The cavities serve as a repository for the MMIC devices and some of the additional components and stripline. Should extraneous resonances be discovered, the insert can be removed and adjusted in size and profile, and replaced, thereby adjusting the cavity without disturbing the electronic components or MMIC's which are secured to the back plate. The foregoing eliminates the restrictions imposed by the prior use of mouseholes and avoids the need for rebuilding the entire housing.

13 Claims, 3 Drawing Sheets

MILLIMETER WAVE ADJUSTABLE CAVITY PACKAGE

This invention was made with Government support under Contract No. NAS7-1260 awarded by the National Aeronautics and Space Administration. The Government has certain rights in this invention.

FIELD OF THE INVENTION

This invention relates to millimeter wave devices, and, more particularly, to a housing or package for such devices.

BACKGROUND

Millimeter wave devices employ a monolithic microwave integrated circuit device or "MMIC" as an active element and operate at very high frequencies, 45 Gigahertz to 120 Gigahertz and higher. The devices may be configured as amplifiers, oscillators and the like electronic devices to perform functions at those high frequencies akin to those functions accomplished at lower frequencies with more familiar amplifier and oscillator architecture. Such millimeter wave devices find application, as example, in MMW radiometers.

The elements of the device are physically quite small. At a frequency of 120 Ghz, one wavelength measures a mere one-quarter of a centimeter in length or slightly less than one-tenth of an inch. MMW devices thus are physically small in size, and its components, including one or more MMIC's, are much smaller still. Although small in size, unlike lower frequency apparatus, the physical dimension of the MMIC, the associated electronic components and the electrical lead wires are large in respect to the wavelength of the operating frequencies. As a consequence lead wires and the like, by which the components are wired into circuit, and even the body of the component can impact the electromagnetic characteristics of the electronic circuit defined with those elements. Thus the development of a new MMW device and the proof of the device's design is complicated by that impact.

For one, it is necessary to shield the device's components and/or electrical leads. Thus it is not possible to mount all the circuit components and MIMICS on a conventional printed circuit board or place the device in a conventional housing, such as used at lower frequencies. The MMW signals in one part of the circuit must be limited to propagating only to precisely defined routes and must not "jump" that route and propagate in undesired ways to parts of the circuit where they would cause interference. As example, because the wavelength is so short, a small electrical lead from a component or interconnection may serve as a full wave or half-wave antenna, and radiate MMW energy from that lead into open space. Other electrical leads in the circuit could likewise act as a full-wave or half-wave receiving antenna, picking up the foregoing radiation.

As more specific example, in the familiar superheterodyne type receiver, a mixer receives MMW energy from an external source and mixes the received signal with another MMW signal supplied by a local oscillator to produce a lower difference frequency or "beat" signal, as variously termed, a process called down-converting. The downconverted signal is then coupled to an IF amplifier, which amplifies that signal. If, however, through the spurious radiation process described, the MMW signal is also coupled to the output of that mixer by means of a spurious path, the mixer's output contains not only the IF signal, but an interfering MMW signal. The combination of those two signals may overload the succeeding IF amplifier. Then too, the two signals may beat together in the IF amplifier creating still additional interference signals.

To avoid such spurious signals, it is necessary to essentially shield each component from every other component in the MMW device. The MMW device's housing or packaging provides that shielding. Thus, to house the active MMIC semiconductor device and the ancillary capacitors and resistors, the practice has been to use a thick metal plate that has been machined to form precisely defined compartments or hollow cavities, referred to as "mouseholes", within the plate's thickness or depth, and provide additional small passages for the interconnecting leads to those elements. The mouseholes are small and narrow, consistent with the small physical size of the components.

The active MMIC devices are formed on substrates. And the MMIC devices and the other electrical components are dropped into their respective mousehole, and fastened in place, suitably with an epoxy adhesive. The open side of the housing is covered with a metal lid, closing the mouseholes.

Typically, machining of the housing to shape is accomplished using Electron Discharge Machining apparatus. That apparatus has the ability to maintain very tight dimensional tolerances and produces cavities with sharply defined square corners, which is desirable. However, discharge machining is an expensive process.

As is familiar to designers of microwave and higher frequency devices, the foregoing assembly of MMW elements into the foregoing package on initial assembly of the first or prototype unit rarely, if ever, produces MMW device performance that conforms to the theoretical operation desired. Although the foregoing package solves one problem, it produces others: the cavity mode resonances.

The adverse effects are due to the fact that the dimensions of the formed cavities, the mouseholes, are all on the same order as the wavelength of those frequencies for which the device is intended to function. Recalling that at 120 MHz, the wavelength is only one-tenth inch and that portions of the electrical leads are located within those cavities, the lead portion again act as an antenna or coupling and the energy radiated therefrom "excites" one or more electromagnetic modes within the respective mouseholes.

A rectangular cavity is capable of supporting, that is, resonating in a number of different modes, including a primary TE01 mode and an indefinite number of higher order modes. The higher the number of the mode, the lower the maximum amplitude of the voltage or intensity. Exact mathematical representations of those modes for a given cavity are available in the technical literature. Any excited mode could cause interference and is undesirable and should be minimized or eliminated entirely.

Although foreseeable, because of the complex nature of mode excitation and lead placement and the shape of the mouseholes, the precise cause of the adverse effects are unpredictable. To the present day, neither close attention to detail in fabricating the completed package or refinement in design procedures have been able to eliminate those effects. As a practical matter, the adverse effects come with the territory.

Thus, following assembly of a prototype MMW device, the procedure is to hunt down and destroy those expected uninvited resonances. This is presently accomplished by inserting high frequency absorbent, "lossy", material, such as Eccosorb material, at strategic locations in the cavities. The Eccosorb material produces an electrical loss to the incident radiation, thereby reducing or minimizing the offending mode or modes.

Although intended to be identical in construction, in the absolute sense each MMW device in a production run differs in physically minute respects from others in the run. An electrical lead from a component in one device may be oriented slightly in position from the corresponding lead in the corresponding component in the next device, creating a small physical difference. However, measured against the wavelength of the frequencies employed, which is, as earlier stated, one-quarter centimeter at 120 GHz, the difference is significant. That difference results in the excitation of a different mode during operation. Thus each device produced in the run must be tested and the unique resonant modes hunted down and destroyed.

Typically the design of a MMW device is confirmed or "proofed" with the production of the first prototype. Often one finds that it is not possible to sufficiently minimize the unwanted resonances in that production prototype. One must refine the design of the mousehole cavities and, essentially, construct a second iteration of a prototype.

Since the components are all permanently fastened in place in the first prototype, and are nearly impossible to remove without damaging the device or the housing, one is left with the prospect of rebuilding the next prototype from scratch. That procedure means repeating the expensive machining procedure to form another metal housing and using up additional valuable MMIC devices. The foregoing is an obvious drain on resources, including manpower, and diverts those resources from more intellectually interesting goals. It begs for a more efficient and streamlined prototyping technique.

MMW devices, such as radiometers, are produced in very very limited quantities and is by no means regarded as a high volume product. Thus quite often fewer than half a dozen in total are produced for a customer. If two or more prototypes need to be produced in order to attain the stage of desired performance, performance that excludes the unwanted resonances, the added development expense can be amortized only over the production run of six, in the example given. And that significantly raises the ultimate per unit cost of MMW devices in the production run.

Accordingly, a principal object of the invention is to simplify and more efficiently develop microwave millimeter wave devices.

A further object of the invention is to provide a new housing or package that simplifies construction of satisfactory prototype millimeter microwave devices.

An additional object of the invention is to easily eliminate excitation of unwanted cavity resonances in the housing mouseholes of the MMW device.

A still further object of the invention is to develop MMW devices without requiring repetitious reconstruction of machined housing packages.

SUMMARY OF THE INVENTION

In accordance with the foregoing objects a package for a high frequency electronic device that employs one or more MMIC devices is formed of a base plate and a plurality of metal inserts removeably fastened to the base plate. The inserts are spaced apart and contain a profiled edge with the profiled edge in one in confronting spaced relationship with that of another of the inserts. Together with the backplate, the profiled edges define elongated cavities with the edges serving as two of the cavities side walls. The foregoing cavities serve as a repository for the MMIC devices and some of the additional components and stripline. The side walls capture at least a portion of the discrete components, including capacitors, resistors, MMIC's.

As an additional aspect, passages are also formed through the inserts, spaced from the profiled edges, to serve as compartments for containment of additional electronic components and allowing those components to be secured directly to the back plate. Shallow grooves defined in the underside surface of the inserts provide passages between the compartment and the cavity, permitting electrical leads from the components to connect with other components and/or MMIC devices installed in the cavity.

The foregoing invention eliminates the need inherent in the prior MMW device packaging of placing substrates and other electronic components into vary narrow cavities, mouseholes, formed in the packaging to prevent appearance of higher order cavity resonances. With the invention, the RF and DC components of the MMW device are placed directly in the module, which reduces the MMW device's assembly time.

The cavity size is determined by the dimensions of the metal insert, not, as in the prior devices, by a cavity machined into the integrated module assembly (IMA) housing. Tight dimensional tolerances requiring electron discharge machining apparatus characteristic of the prior MMIC housings are eliminated.

The foregoing construction permits easy re-machining or replacement of an improperly sized or out of tolerance cavity. Following adhesive fastening of the MMIC's, substrates, and other electronic components in place in the housing, the metal inserts can be removed, remachined, and reinstalled allowing adjustment of the cavity size to eliminate undesired cavity oscillations that may have been introduced by installation those electronic components. The MMIC's, substrates and other electronic components remain in place undisturbed on the housing during such adjustment.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DETAILED DESCRIPTION OF THE PREFERRED EMBODIMENTS

Figure 1:
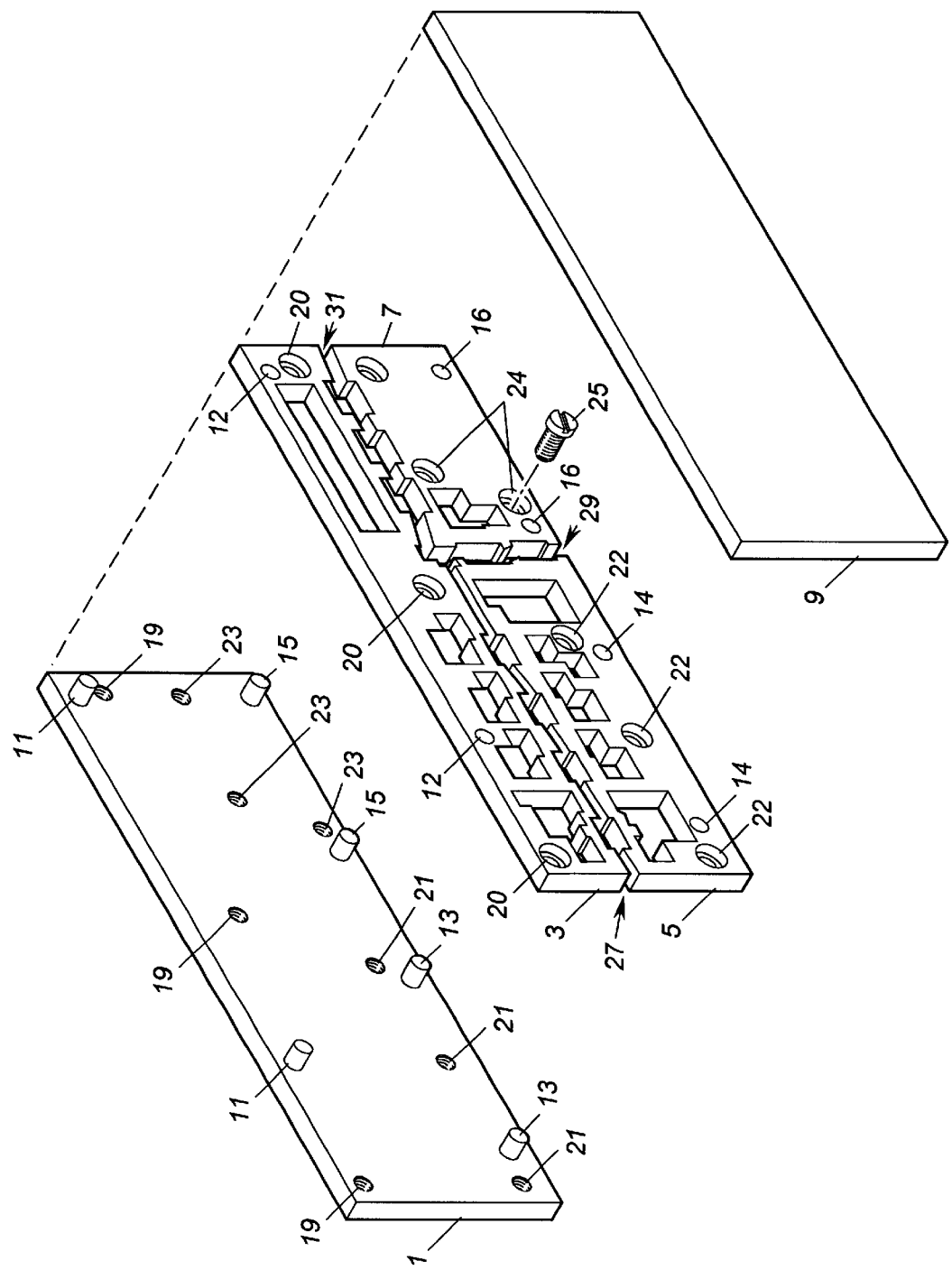
FIG. 1 shows the new package in an exploded view.

A MMW device package is best described in connection with a radiometer application, more particularly a front end unit for a radiometer, such as illustrated in exploded view in FIG. 1. The package contains a metal base or base plate 1, three smaller individual plates, referred to as inserts, 3, 5, and 7, and, optionally, a metal cover plate or cover 9, which, as assembled, are sandwiched together in a unitary assembly. The inserts, though physically separate from one another, are illustrated arranged in a common plane, as they would appear when assembled to base plate 1, with confronting edges spaced from each other.

Base plate 1 contains six small cylindrical shaped guide pins 11, 13, and 15, suitably two guide pins for each of the three inserts to aid in positioning the inserts on the surface of the base plate. Each of the inserts contains guide holes extending through the insert's thickness, such as guide holes 12 in insert 3, guide holes 14 in insert 5 and guide holes 16 in insert 7. By design those guide holes correspond in spacing and position with associated guide pins on the base plate. Ideally those guide pins are located to an accuracy of one mil or better and enter the guide holes in the inserts with a slip fit. To fasten the inserts in place, the base plate also contains a series of threaded bolt passages 19, 21, and 23, suitably three for each of the inserts.

The inserts contain bolt passages there through at locations that correspond in spacing and position with associated threaded bolt passages on the base plate. Thus bolt holes 20 are included in insert 3, bolt holes 22 are contained in insert 5 and bolt holes 24 in insert 7. Suitably the top end of those bolt passages is of wider diameter to accommodate and receive the bolt head in order that the bolt head does not protrude above the upper surface of the associated insert.

With the inserts positioned on the associated guide pins in the base plate, bolts 9, only one of which is illustrated, are screwed into place to securely fasten the inserts in place to the base plate. This is a removable fastening, which is used to advantage to permit the insert to be removed and replaced, as later herein described.

Following installation of all electrical components and MMIC' devices, not illustrated, but later herein discussed, onto the base plate and fastening down of the inserts, the cover 9 is welded in place atop the inserts. For in-flight use in a radiometer, the cover, alternatively, may be screwed to those inserts, in which case the inserts would be modified to incorporate threaded bolt holes on the upper surface. The cover provides a shield at the open side of the cavities for the enclosed electronic components.

As assembled, the three inserts are spaced apart from each other on the upper surface of base plate 1, with the confronting side edges of those inserts defining therewith three passages or cavities 27, 29 and 31 that intersect at a junction. This is better illustrated in the top and bottom views of FIGS. 2 and 3, next considered.

Figure 2:
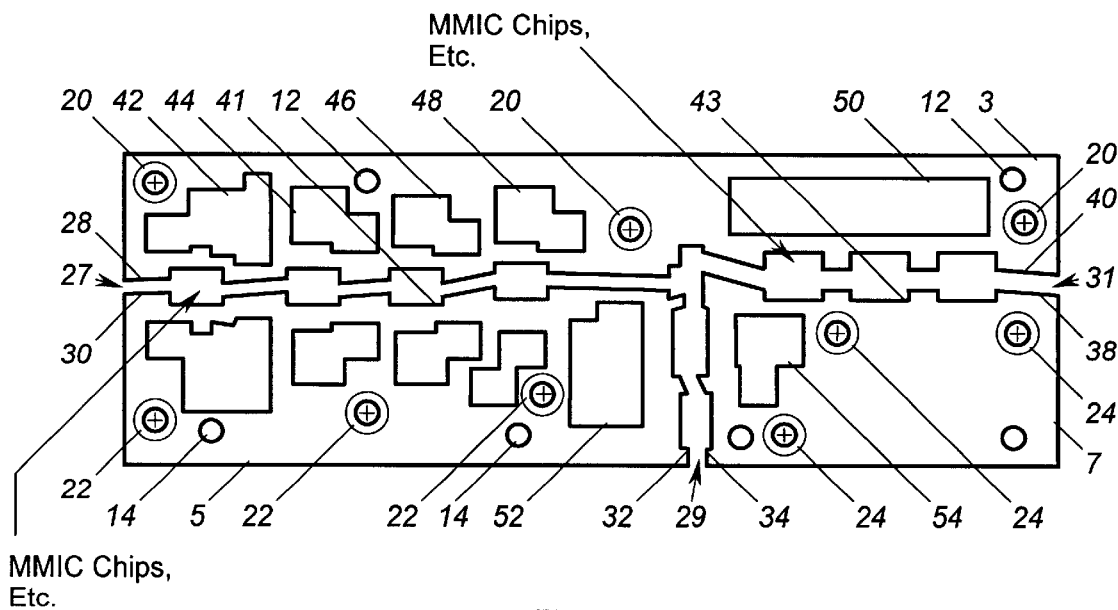
FIG. 2 shows three of the elements of the embodiment of FIG. 1 in assembled relationship in top view.

Reference is made to the top view of FIG. 2, which shows the three inserts 3, 5, and 7 in assembled relationship, properly spaced. Cavity 27 is defined between the confronting spaced edges 28 and 30, of inserts 3 and 5, respectively. Another cavity 31 is defined between the confronting spaced edges 32 and 34 of inserts 5 and 7, respectively. And the third cavity 31 is defined between the confronting spaced edges 38 and 40 of inserts 7 and 3, respectively. Those confronting insert edges bordering portions of the inserts periphery are contoured or profiled, as variously termed, and serve as cavity walls to the adjoining cavity. Those walls are parallel to one another and, when assembled, are perpendicular to the base plate surface, the latter of which serves as a bottom cavity wall. By design the guide pins in the base plate are perpendicular to the surface of the base plate in order to maintain the profiled edges of the inserts in parallel and oriented perpendicular to the base plate. The cavity's height is essentially equal to the thickness or depth of the inserts, which are preferably of equal thickness. The cited cavities intersect at a common junction or location as illustrated.

Although the elongate cavities are made as narrow as possible to accommodate microwave strip line conductors, the cavity is widened at various locations along its length, as example at 41 where a complementary rectangular shape slots in opposed edges of the inserts define a wide rectangular area in cavity 27. This wider area is necessary to physically accommodate a MMIC chip, which is larger in size than the narrow portion. In this embodiment, cavity 27 contains three additional wide rectangular shaped spaces. Likewise, cavity 31 accommodates three MMIC amplifiers in respective ones of the three rectangular spaces, such as 43, and cavity 29 contains two such large rectangular spaces, such as 45. As earlier mentioned, the housing is for a front end of a radiometer, illustrated in FIG. 5, later discussed, and that front end includes a mixer, an active MMIC element. That mixer is positioned at the intersection of the three cavities, enabling the mixer to receive RF signals inputted via cavities 27 and 29, and provide an output into cavity 31. To accommodate that mixer, the ends of the three cavities are also widened sufficiently.

Guide pins 11 properly locate insert 3 on the base plate relative to the other inserts. Likewise guide pins 13 properly locate insert 5 and guide pins 15 properly located insert 7 to the requisite position and spacing, wherein the width of the passage is of the desired dimension. The inserts are then screwed into place.

In addition to forming the cavity wall, the inserts also contain cut-out sections or, as variously termed, large sized through-hole passages to provide pockets or compartments in which to mount the bypass capacitors and resistors that set the bias conditions for the respective MMIC chips installed in the respective cavities. Insert 1 contains compartment 42, 44, 46 and 48 and also a large rectangular compartment 50. Insert 4 in this embodiment contains five compartments 52, only one of which is numbered, and insert 7 contains one compartment 54. The compartments extend through the insert, from top to bottom. As shown in the bottom view of FIG. 3 to which reference is made, those compartments open on the bottom side, allowing the upper surface of base plate 1, when assembled to the inserts, to serve as the compartment's floor.

Figure 3:
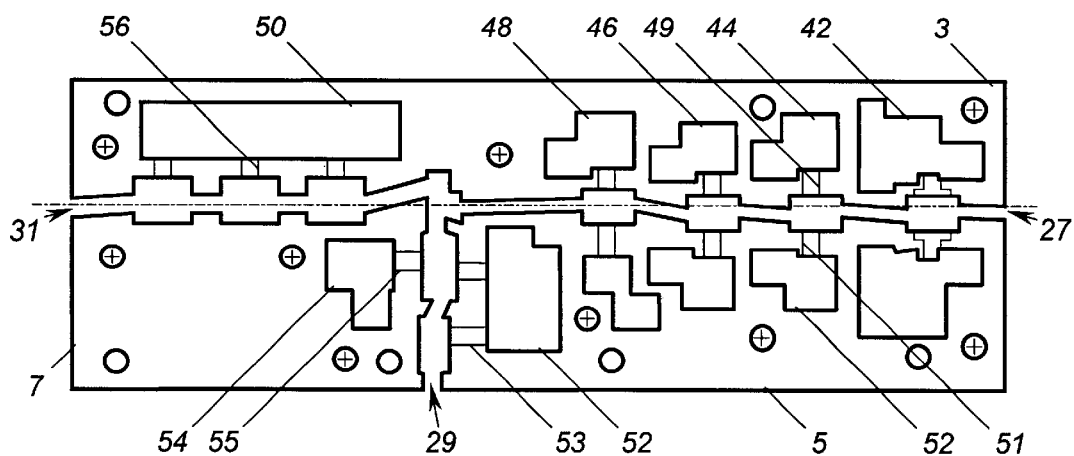
FIG. 3 shows the elements of FIG. 2 in a bottom view.

As is visible in FIG. 3, a short shallow narrow groove 49 formed on the underside of insert 3 extends between compartment 44 and elongated cavity 27. The groove serves as a passage for the electrical leads from the component disposed within compartment 44 and those components or devices located within the elongated cavity. With the component installed in the portion of the baseplate 1 that underlies compartment 44 in insert 3, its electrical leads are routed through the groove passage 49 to an appropriate electrical connection on the associated MMIC chip that is disposed in the cavity 27. To the left, three lead grooves, only one of which 56 is labeled, extend between compartment 50 and spaced positions along elongated cavity 31. Other like grooves extend between the other compartments illustrated and the adjacent cavity and serve like function. Thus lead groove 51 is associated with compartment 52 in insert 5, and additional lead passages, not numbered extend between the illustrated compartments, not numbered in insert 3 and cavity 27. Along the side of insert 5, lead groove 53 extends between compartment 52 and cavity 29, and another like groove, spaced therefrom also extends between another side of that compartment and cavity 29. Insert 7 contains a lead groove 55 extending between compartment 54 and cavity 29.

Returning to FIG. 1, the inserts collectively fit within the upper surface area of base plate 1. Apart from the profiled edge along two portions of the inserts periphery, the outer periphery of insert 3 is straight so as to be flush with outer edges of the base plate, which is rectangular shape in this embodiment. Likewise two of the edges insert 5 and two of insert 5 are also straight and oriented at right angles to one another for the same reason. With cover 9, the inserts and the base plate sandwiched together, the package defines a rectangular geometry of short height that may be fitted within a predefined slot-like compartment in other equipment, not illustrated.

Figure 4:
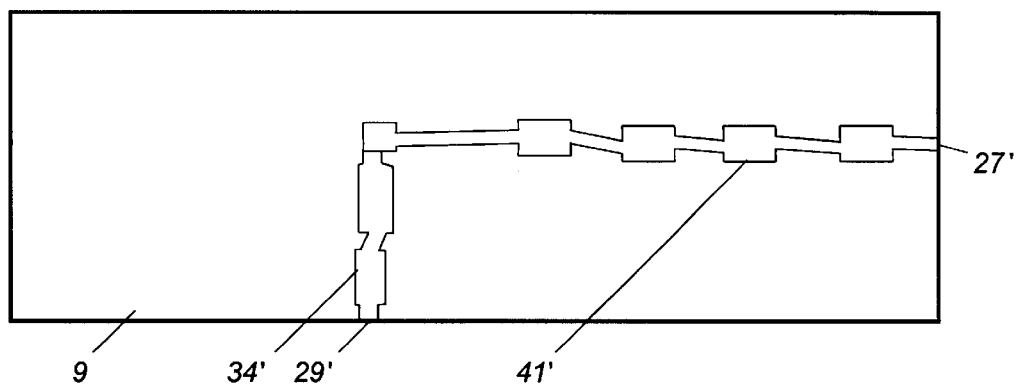
FIG. 4 illustrates a bottom view of the cover used in the foregoing embodiment.

Reference is made to FIG. 4, providing a view of the underside of cover 9. Ideally, the top and bottom side surfaces of cover 9 should be flat. However, when, as in the present embodiment, it is desired to limit the total thickness or height of the package to a predetermined dimension governed by space available in the external equipment, the thickness or height of the inserts 3, 5 and 7 might be smaller than the height of the MMIC devices installed in some of the compartments, such as those MMIC devices disposed in compartments 41 in passage 27 and compartments 34 in passage 29, shown to the left in FIG. 2.

To accommodate that excess in the component's height, appropriate grooves are formed in the underside surface of cover 9. Thus, as illustrated, the cover contains an elongate cavity 27' containing compartments 41' and an elongate cavity 29', which insects cavity 27', containing compartments 34' formed by shallow grooves. For convenience the foregoing cavities are identified by the same numbers as the corresponding cavities and compartments defined in inserts 3 and 5 in FIG. 2, but primed. The foregoing cavities and their included compartments formed in the cover overlay and cover the mating cavities and compartments defined in inserts 3 and 5. This may be visualized by inverting FIG. 4 and applying it over the top view of the inserts in FIG. 2.

Suitably, the metal used to form the foregoing base plate, inserts and cover is the well known A-40 material, an aluminum silicon compound, which is light in weight, of high thermal conductivity and is easily machined. That material also allows direct attachment of MMIC chips and fused silica substrates directly to the floor of the housing, the base plate. Preferably the A-40 metal is plated with a Nickel Gold plating, a Nickel layer followed by a Gold layer overlay to enhance the surface's electrical conductivity.

Returning to FIG. 2, it is appreciated that the projection of the three inserts 3, 5 and 7 onto the base plate 1 defines a pattern for the regions of the base plate left uncovered, the regions underlying the component compartments and the elongated cavities. That pattern may be marked onto base plate 1 in any convenient way. Further, the foregoing pattern may be enhanced by manually adding to it, the outline of the various lead grooves, earlier described in connection with FIG. 3 formed on the back side of the inserts.

With that pattern, the electrical components, MMIC devices and leads may be directly installed in place on the base plate 1 within the regions of the pattern defined by the outlines of the respective compartments, cavities and grooves. The RF/DC bias circuitry and local oscillator components are all located on the same side of the housing. The technician may assemble and wire bond those elements together in circuit without being physically constrained by the side edges or compartment walls of the inserts. Thus wire bonders may easily be positioned and used to wire bond electrical components in the desired circuit arrangement. Thereafter the inserts may be placed in position and fastened in place, making minor adjustments as necessary to the position of the leads. Alternatively, the technician may install one or more of the inserts in place and then mount the components, MMIC chips and leads in place.

An initial benefit of the foregoing construction is apparent. The compartments expose an area of the underlying base plate. That exposed area or floor serves as a fastening location for the electrical components located in the compartment. The components are typically adhesively joined by epoxy to the exposed base plate area underlying the associated pocket firmly holding the components in place. Once bonded, removal of the components is very difficult. The electrical leads from those components are extended into the cavity area through the bottomless lead grooves. Should it be desired to remove the insert for any reason, such as elsewhere herein discussed, once the screws attaching the insert to the base plate are removed, the insert may be lifted off of the base plate, leaving the electrical component and leads undisturbed and in place. The insert may thereafter be replaced in position and screwed back in place as those components and leads remain in proper alignment with the openings in the insert.

The foregoing housing construction offers faster and more efficient assembly operation. The technician need only place a pattern of the cavities, pockets and lead routings on the base plate, and then proceed to mount all of the electronic components and stripline within the confines of that pattern, including bonding all the electrical connections. Thereafter, the technician may install the inserts in place.

With the new package, the technician is no longer burdened by the tedious and time consuming task of wire bonding connections in physically small mouseholes using wire bonders not designed for that purpose. It is found that the smallest size wire bonder tip available is still larger than desired for the small size confines of a mousehole; and due to the lack of volume production of MMW devices using the prior housing design, no incentive for the wire bonder manufacturer to develop physically smaller bonding tips and make them available at a reasonable price. Working with existing wire bonders in MMW device application required the technician to shoulder a near impossible burden. The present invention avoids that problem, making MMW device manufacture quicker and more efficient.

Figure 5:
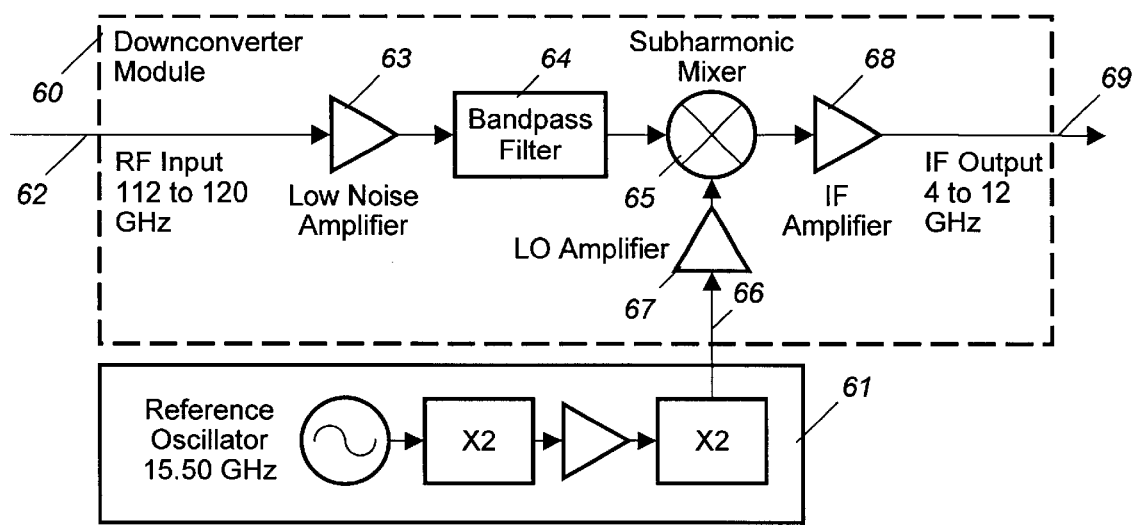
FIG. 5 is a block diagram of the radiometer front end that is to be housed in the package of FIGS. 1–4, identifying the various electronic functions of the components.

A front end circuit 60 for a MMW radiometer is schematically illustrated in FIG. 5, surrounded by dash lines, together with a local oscillator module 61 in an adjacent block. Typically the radiometer's front end includes an input 62 for the received MMW signal, a low noise amplifier 63, which comprises one or more amplifier stages, a band pass filter 64x, a sub-harmonic mixer 65, a local oscillator input 66 for receiving a local oscillator signal from oscillator module 61, an amplifier 67 for that signal, whose output is coupled to a mixer input, an IF amplifier 68, comprising one or more IF amplifier stages. In operation the signal received at input 62 is amplified, filtered and applied to one input of mixer 65. The mixer mixes or beats that signal together with the local oscillator signal from input 66, producing, for one, a signal of a frequency that is equal to the difference in frequency between the former to signals, called the IF signal. That IF signal is amplified and routed to output 69, from where it is fed to other signal processing circuits, not illustrated, of the radiometer.

It is appreciated that the foregoing circuit illustrates a classic frequency downconversion system. As earlier noted should the housing for the circuit be such that the signal at input 62 finds an alternative path to amplifier 68, or should the signals from any of the devices excite a cavity mode to produce another signal, either such signal could interfere with proper operation of the mixer 65 and/or IF amplifier 68. The mechanical aspects of the device's housing ideally must not permit the creation of adverse electromagnetic effects or should any such adverse be created, it should be easily absorbed through introduction of microwave loss material, such as Eccosorb material, into the housing. The disclosed housing satisfies that criteria.

To develop an electronic device at the high frequencies employing MMIC devices, such as the radiometer front end depicted in FIG. 5, the designer determines the number of electronic components needed and ancillary thereto the size of the cavities and compartments needed in the housing. The housing is then fabricated, resulting in an initial configuration of the back plate, inserts and cover. The components are assembled together into the housing in any of the procedures earlier described. The design is then tested, recognizing that the goal is to finalize a design both electrically and physically that may be later reproduced in larger quantities. Should any undesired resonances be uncovered during test, it requires the judgment and skill of the designer to uncover its cause. Obviously, the procedure for doing so is not material to the present invention and goes beyond the scope of the specification. Accordingly, it is possible only to consider a hypothetical cause to a hypothetical problem.

Figure 6:
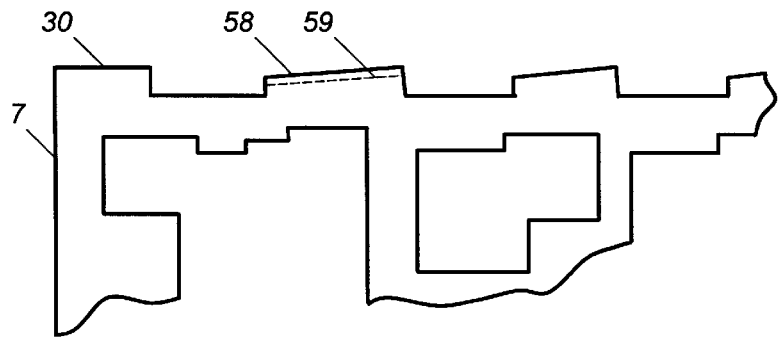
FIG. 6 is an enlarged partial view of one of the elements shown in FIGS. 2 and 3 used to assist the reader to understand a benefit of the invention.

Reference is made to FIG. 6, which partially illustrates in greatly enlarged scale, a portion of insert 7 in FIG. 3. Assuming the designer determines that the cause of an undesired resonance uncovered in testing is that the edge 58 of insert 7 is too high, and that shortening that edge to the height represented by dash line 59 would cure the problem. The designer simply removes cover 9 and unscrews the screws holding insert 7 in place. The insert is then handed over to a machinist with appropriate instructions. Upon return the insert, now with edge 58, is replaced on the back plate, covered and the unit is retested. In the foregoing procedure, the electronic components remain in place adhering to the back plate. The foregoing procedure may be repeated many times until testing shows satisfactory performance. In the foregoing procedure, should it be determined that too much material was cut away, then all that is necessary to do is to replace the damaged insert with another identical one, and begin trimming anew. Once the exact dimensions of the inserts are determined for proper performance of the electronic circuit, then additional copies may be easily reproduced and used to assemble additional units of the electronic device.

Modifications of the foregoing housing become apparent to those skilled in the art. As example, although guide pins are used to position the inserts, as those skilled in the art appreciate, that is a static arrangement. As an improvement, to provide greater flexibility to the package, the guide pins may be mounted, alternatively, to a conventional positioning mechanism, such as a screw and traveler, that is mounted to the underside of the base plate. By moving the positioner mechanism the associated guide pin may be adjusted in position about the base plate's upper surface, and that would change the position of the insert associated with the guide pins. By such means the spacing and relative angular orientation of the inserts may be adjusted.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. An integrated module housing for a MMIC device comprising:

a metal base;

said metal base including a flat support surface, a plurality of guide pins protruding from said flat support surface, and a plurality of tapped bolt holes extending into said flat support surface;

a first thick metal insert fastened to said metal base;

said first thick metal insert including:

a bottom flat surface for abutting engagement with said flat support surface, and an edge along a perimeter of said insert, said edge being profiled in a first predetermined configuration;

said first thick metal insert further including at least two guide pin holes and at least three bolt passages; said two guide pin holes being aligned with respective ones of said plurality of guide pins in said metal base and said bolt holes being aligned with respective ones of said plurality of tapped bolt holes in said metal base, whereby said first thick metal insert may be aligned and fastened to said base;

a plurality of bolts for fastening said first thick metal insert to said metal base, said bolts extending through said bolt passages and into respective ones of said tapped bolt holes;

a second thick metal insert fastened to said metal base, said second thick metal insert including a flat surface for abutting engagement with said flat support surface, and an edge along a perimeter of said insert, said edge being profiled in a second predetermined configuration;

said second thick metal insert including at least two guide pin holes and at least three bolt passages; said two guide pin holes being aligned with respective ones of said plurality of guide pins in said metal base and said bolt holes being aligned with respective ones of said plurality of taped bolt holes in said metal base; and bolts for fastening said second thick metal insert to said metal base;

said first and second thick metal inserts being spaced apart in position on said flat support surface with said respective profiled edges of said first and second thick metal inserts being oriented in spaced confronting relationship to define opposite side walls to an elongate cavity, wherein a portion of said flat support surface lies between said side walls and defines a bottom wall to said elongate cavity; and a metal cover to cover said first and second thick metal inserts and close said elongate cavity.

2. The invention as defined in claim 1, wherein said first thick metal insert includes:

at least one compartment spaced from said profiled edge, said compartment extending through said first thick metal insert to expose an underlying portion of said first support surface;

a shallow narrow groove in an underside surface of said thick metal insert, said groove extending between said one compartment and said profiled edge to define a lead passage between said compartment and said elongate cavity.

3. The invention as defined in claim 2 wherein each of said metal base and said first and second thick metal inserts comprise an Aluminum Silicon compound.

4. The invention as defined in claim 3, wherein said aluminum silicon compound is covered with a plating of Nickel, and said Nickel is covered by a plating of Gold.

5. The invention as defined in claim 2, wherein said second thick metal insert includes:

at least one compartment spaced from said profiled edge, said compartment extending through said second thick metal insert to expose an underlying portion of said first support surface;

a shallow narrow groove in an underside surface of said thick metal insert, said groove extending between said one compartment and said profiled edge to define a lead passage between said compartment and said elongate cavity.

6. The invention as defined in claim 1, wherein said second thick metal plate contains a second edge along a perimeter thereof, said second edge being profiled in a third predetermined configuration; and wherein said first thick metal plate includes a second edge, said second edge being profiled in a fourth predetermined configuration, said second edge being connected to an end of said first edge; and further comprising:

a third thick metal insert fastened to said metal base adjoining each of said first and second thick metal inserts, said third thick metal insert including a flat bottom surface for abutting engagement with said flat support surface, a first edge along a perimeter of said third thick metal insert, and a second edge along another perimeter of said third thick metal insert, said second edge being connected at an end to said first edge thereof;

said first edge of said third thick metal insert being profiled in a fifth predetermined configuration;

said second edge of said third thick metal insert being profiled in a sixth predetermined configuration;

said third thick metal insert including at least two guide pin holes and at least three bolt passages; said two guide pin holes being aligned with respective ones of said plurality of guide pins in said metal base and said bolt holes being aligned with respective ones of said plurality of tapped bolt holes in said metal base; and bolts for fastening said third thick metal insert to said metal base;

said third thick metal insert being positioned by said respective guide pins in spaced relation to each of said first and second thick metal inserts with said first profiled edge in spaced confronting relationship to said second profiled edge of said second thick metal insert to define a second elongate cavity, said second elongate cavity being interconnected with said first cavity, and said second profiled edge being in spaced confronting relationship to said second profiled edge of said first thick metal insert to define a third elongate cavity, said third elongate cavity being interconnected to said first elongate cavity.

7. The invention as defined in claim 6, wherein said third thick metal insert includes:

at least one compartment spaced from said profiled edge, said compartment extending through said third thick metal insert to expose an underlying portion of said first support surface;

a shallow narrow groove in an underside surface of said thick metal insert, said groove extending between said one compartment and said profiled edge to define a lead passage between said compartment and said elongate cavity.

8. An integrated module housing for a MMIC device comprising:

a metal base;

said metal base including an upper surface;

a first thick metal insert removably fastened to said metal base;

said first thick metal insert including:

a bottom surface for abutting engagement with said upper surface, and an edge along a perimeter of said insert, said edge being profiled in a first predetermined configuration;

a second thick metal insert removably fastened to said metal base, said second metal insert including a bottom surface for abutting engagement with said upper surface, and an edge along a perimeter of said insert, said edge being profiled in a second predetermined configuration;

said first and second thick metal inserts being spaced apart in position on said upper surface with said respective profiled edges of said first and second thick metal inserts being oriented in spaced confronting relationship to define opposite side walls to an elongate cavity for receiving at least a plurality of microstrip lines and MMIC devices, wherein a portion of said flat support surface lies between said side walls and defines a bottom wall to said elongate cavity and a bonding surface to bond in place said plurality of microstrip lines and MMIC devices; wherein said metal inserts may be detached and temporarily removed from said metal base for service without requiring detachment of any microstrip lines and MMIC devices.

9. The invention as defined in claim 8, wherein said first metal insert includes:

at least one compartment spaced from said profiled edge, said compartment extending through said first metal insert to expose an underlying portion of said upper surface to provide a bondable surface for bonding thereto an electrical component received in said compartment;

a shallow narrow groove in an underside surface of said metal insert, said groove extending between said one compartment and said profiled edge to define a lead passage between said compartment and said elongate cavity for passing electrical leads between said electrical component in said compartment to MMIC devices in said elongate cavity, whereby said metal inserts may be detached and temporarily removed and serviced without detaching any electrical components.

10. The invention as defined in claim 9 wherein each of said metal base and said first and second metal inserts comprise an Aluminum Silicon compound.

11. The invention as defined in claim 10, wherein said aluminum silicon compound is covered with a plating of Nickel, and said Nickel is covered by a plating of Gold.

12. The invention as defined in claim 9, further comprising:

a metal cover to cover said first and second metal inserts and close said elongate cavity.

13. The invention as defined in claim 10, further comprising:

a metal cover for covering said first and second metal inserts.

* * * * *